(12) United States Patent
Filo et al.

(10) Patent No.: US 7,120,509 B1
(45) Date of Patent: Oct. 10, 2006

(54) SOUND AND IMAGE PRODUCING SYSTEM

(75) Inventors: Andrew S. Filo, Cupertino, CA (US);
David G. Capper, Novato, CA (US)

(73) Assignee: Hasbro, Inc., Pawtucket, RI (US)

( * ) Notice: Subject to any disclaimer, the term of this patent is extended or adjusted under 35 U.S.C. 154(b) by 0 days.

(21) Appl. No.: 09/513,656

(22) Filed: Feb. 25, 2000

Related U.S. Application Data

(60) Provisional application No. 60/154,602, filed on Sep. 17, 1999, provisional application No. 60/184,688, filed on Feb. 24, 2000.

(51) Int. Cl.
*G06F 17/00* (2006.01)
*H04R 23/00* (2006.01)
*G11B 31/00* (2006.01)
*A63H 3/33* (2006.01)

(52) U.S. Cl. .................. 700/94; 381/151; 446/397; 446/297; 369/63; 369/64

(58) Field of Classification Search ............... 700/94; 446/297; 438/110
See application file for complete search history.

(56) References Cited

U.S. PATENT DOCUMENTS

| | | | |
|---|---|---|---|
| 4,285,554 A * | 8/1981 | Bell et al. .................. 312/9.63 |
| 4,287,568 A | 9/1981 | Lester | |
| 4,614,144 A * | 9/1986 | Sagara et al. ................. 84/609 |
| 4,698,776 A | 10/1987 | Shibata | |
| 4,884,974 A | 12/1989 | DeSmet | |
| 5,045,327 A | 9/1991 | Tarlow et al. | |
| 5,073,140 A | 12/1991 | Lebensfeld et al. | |
| 5,092,810 A | 3/1992 | Kwan et al. | |
| 5,147,237 A | 9/1992 | Kwan et al. | |
| 5,159,182 A * | 10/1992 | Eisele ....................... 235/492 |
| 5,325,463 A | 6/1994 | Murata et al. | |
| 5,359,698 A | 10/1994 | Goldberg et al. | |
| 5,365,686 A * | 11/1994 | Scott ............................ 40/455 |
| 5,410,762 A * | 5/1995 | Maskovich ..................... 2/338 |
| 5,491,774 A | 2/1996 | Norris et al. | |
| 5,579,284 A * | 11/1996 | May ........................... 367/132 |
| 5,607,336 A * | 3/1997 | Lebensfeld et al. ......... 446/297 |
| 5,654,942 A * | 8/1997 | Akahane ........................ 369/2 |
| 5,710,813 A | 1/1998 | Terui et al. | |
| 5,724,482 A * | 3/1998 | Grewe et al. ............... 704/501 |
| 5,742,737 A | 4/1998 | Daberko et al. | |

(Continued)

FOREIGN PATENT DOCUMENTS

EP 0 498 577 A 8/1992

(Continued)

*Primary Examiner*—Sinh Tran
*Assistant Examiner*—Daniel R. Sellers
(74) *Attorney, Agent, or Firm*—Perry Hoffman

(57) ABSTRACT

An invented sound and image producing system is disclosed. The system may include a cartridge that stores, processes and controls data representative of sound and/or images, and a player that provides the interface, annunciation and transduction of sound and/or images. The cartridge includes a computer integrated circuit or chip that stores and transmits signals from which sound and/or images may be produced. The system also may include a source of signals representative of sound, an audio port associated with the source and through which signals representative of sound may be sent, and a device configured to receive and store signals representative of sound, and to produce sound from such signals, where the device is configured to connect with the audio port and to receive and store signals representative of sound transmitted from the source through the audio port to the device.

37 Claims, 7 Drawing Sheets

U.S. PATENT DOCUMENTS

| | | | |
|---|---|---|---|
| 5,749,088 A | | 5/1998 | Brown et al. |
| 5,774,863 A | | 6/1998 | Okano et al. |
| 5,787,399 A | | 7/1998 | Lee et al. |
| 5,815,426 A | * | 9/1998 | Jigour et al. .................. 365/51 |
| 5,826,235 A | | 10/1998 | Harman |
| 5,855,001 A | | 12/1998 | Doederlein et al. |
| 5,870,710 A | * | 2/1999 | Ozawa et al. ............... 704/500 |
| 5,879,169 A | | 3/1999 | Wu et al. |
| 5,903,871 A | | 5/1999 | Terui et al. |
| 5,908,344 A | * | 6/1999 | Kociemba .................... 446/297 |
| 5,991,727 A | * | 11/1999 | Ono et al. .................. 704/270 |
| 6,039,260 A | * | 3/2000 | Eisele ........................ 235/492 |
| 6,327,633 B1 | * | 12/2001 | Chawla et al. ................ 710/62 |
| 6,405,213 B1 | * | 6/2002 | Layson et al. ............ 707/104.1 |
| 6,445,451 B1 | * | 9/2002 | Douglas-Hamilton et al. ... 356/425 |
| 6,707,924 B1 | * | 3/2004 | Okiebisu .................... 381/385 |

FOREIGN PATENT DOCUMENTS

| | | |
|---|---|---|
| EP | 0 875 816 A | 11/1998 |
| EP | 0 926 769 A | 6/1999 |

* cited by examiner

SOUND AND IMAGE PRODUCING SYSTEM

CROSS REFERENCE TO RELATED APPLICATION

This application is based upon and claims the benefit under 35 U.S.C. § 119 of U.S. Provisional Application Ser. No. 60/154,602, filed Sep. 17, 1999, and U.S. Provisional Application Ser. No. 60/184,688, filed Feb. 24, 2000, both of which are incorporated herein by reference.

TECHNICAL FIELD

This invention relates to sound and image producing systems. More particularly, this invention relates to a system having cartridges that store, process and control data representative of sounds and/or images, plus players that interface, annunciate and transduce sounds and/or images.

BACKGROUND AND SUMMARY

Sound and/or image producing devices such as cassette players, compact disc players, hand-held video games, etc., are popular entertainment devices. They make use of cassette tapes, compact discs or game cards that store information such as music and game commands. The cassette or compact disc player or hand-held video game receives the information stored on the tape, disc or card, and processes that information to produce sound and/or visual image's.

The invented sound and image producing system is an alternative to existing cassette players, compact disc players and other such items in that it allows a user to conveniently produce sound, such as music, and/or visual images. The system includes a cartridge that stores, processes and controls data representative of sound and/or images, and a player that provides the interface, annunciation and transduction of sound and/or images. The cartridge includes a computer integrated circuit or chip that stores and transmits signals from which sound and/or images may be produced. For example, the cartridge includes memory, data stored in the memory, a processing system, programming executable by the processing system, and at least one connector to releasably connect the cartridge to the player. The cartridge may include a single chip or integrated circuit, with the memory, processing and other functions all performed by the chip, such as an EMC 2200 chip or a PowerSpeech 2500 Series chip from Winbond Electronics Corporation of Taiwan. The chip may be mounted on a printed circuit board with a timing resistor, if necessary, and the connector or connectors may be associated with the printed circuit board.

The player, in contrast, is a bridge configured to receive and connect to the cartridge, to receive electrical signals from the cartridge, and to produce sound vibrations and/or visual images from the signals. The player includes a transducer to produce the sound vibrations, a battery or other power supply, and controls to trigger the cartridge to produce and transmit electrical signals representative of sound. The player may include an output, such as a liquid crystal diode, to display images. The player includes only those components necessary to produce sound vibrations and/or images from the signals received from a cartridge, a battery, and associated input or output components. The player need not include any processor, memory or other similar items because those items are resident on the cartridge. Expressed differently, the player includes only electrical components such as switches, a speaker, an LCD and a battery, while the cartridge includes electronic components such as a computer or micro-processor, an analog-to-digital converter and memory.

The cartridge typically has a side-to-side dimension of no more than 2 inches, and often less than 1 inch, because the cartridge is essentially a single chip. The player typically has a side-to-side dimension of no more than 3 inches, and often only slightly greater than a cartridge. This small size allows the system to be worn as a necklace or bracelet, be attached to clothing, bags or packs (such as by a clip or as a fob or zipper pull), or take the form of a toy or figurine.

One use of the sound producing system is to play popular music easily and inexpensively. Users may purchase and collect the cartridges, plug them into a player, and then listen to music. Users may also trade cartridges amongst themselves. The system is small, so it is easily carried. For example, high school students may clip players to a zipper on their backpacks.

DETAILED DESCRIPTION

Figure 1:
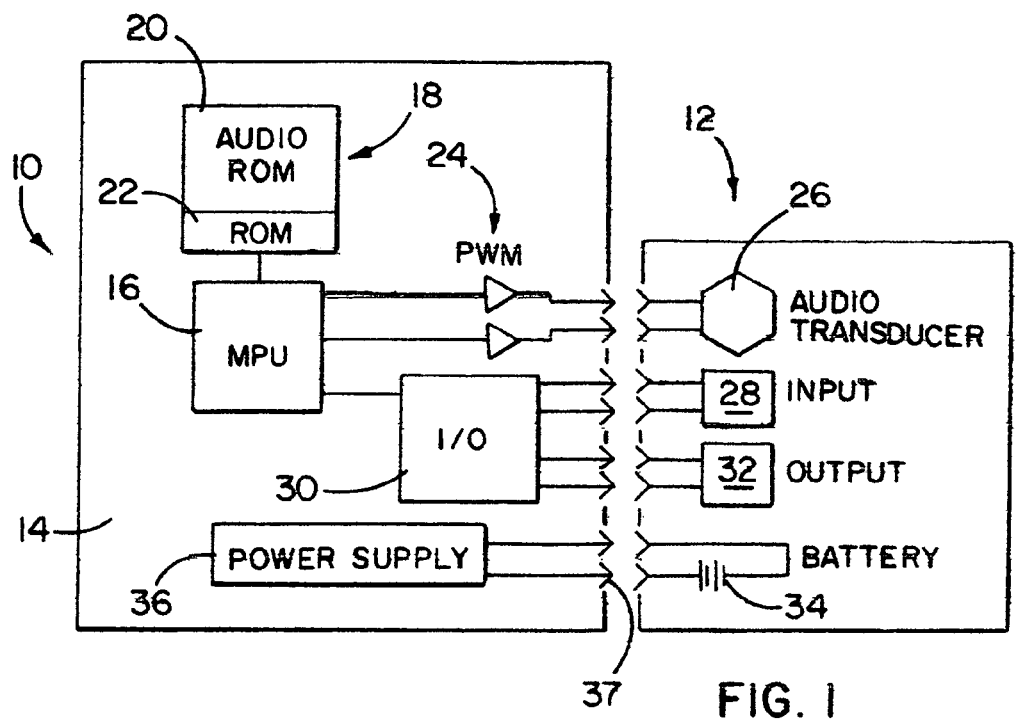
FIG. 1 is a schematic drawing of an embodiment of the invented sound and image producing system.

FIG. 1 is a schematic drawing of an embodiment of the invented sound and image producing system, including a cartridge 10 and a player 12. The cartridge includes an integrated circuit 14, having a micro-processor unit 16, and memory 18. Memory 18 includes what is referred to as audio ROM 20 to store sound data. The sound data may be stored with standard compression techniques. Memory 18 also includes ROM 22 to store other data, such as programming, decompression files, etc. The micro-processor unit 16 executes programming to produce electrical signals representative of sound from the data representative of sound, and then sends those signals to a pulse-width modulator 24, which outputs a signal to drive an audio transducer 26, such as a speaker, in player 12. Integrated circuit 14 may be mounted on a printed circuit board with a timing resistor and connectors associated with the printed circuit board.

Transducer 26, as stated, may be a speaker. Alternatively, audio transducer 26 may comprise earphones or an ear bud plugged into a jack on the player. The audio transducer also may take the form of a structure configured to contact a user's teeth, such as a "bite bar," so that sound vibrations are transmitted from the player through the teeth to the user's inner ear where they are perceived by the user as sound. This configuration provides a fun way to listen to sounds "in your head," without others hearing the sounds. The transducer may also be a combination of speakers, earphones and bite bars.

Player 12 includes controls 28, labeled input, to trigger cartridge 10 to perform various functions. For example, controls 28 may trigger the cartridge to play music. The controls also may be used to set volume, select different songs or tracks stored on the cartridge, turn the system on or off, or put the system in a stand-by mode. Signals from the controls 28 are input to input/output (I/O) circuitry 30 on the cartridge, to control micro-processor unit 16.

Micro-processor unit 16 also may send signals through I/O circuitry 30 to an output 32 associated with the player. Output 32 may take several forms, such as an LCD to display visual images, an LED, or a motor driving a mechanical device, such as a dancing doll. The output device may be used in playing a game with the system, displaying information about music, such as the name of an artist, the title of a song, or a track being played, displaying a video clip or image associated with the music, or displaying information about the system, such as a "battery low" indication. For example, a game and music both may be stored on the cartridge, and the game played by operating controls 28 while the system plays a user's favorite music. The action of the game may be displayed on output 32. Of course, systems may be made without output 32.

Player 12 also includes a battery 34 to supply power to the system. The battery is connected to power supply circuitry 36 on the cartridge. The power supply circuitry regulates the power from the battery for the cartridge.

One of the benefits of the system shown in FIG. 1 is that the player is simple and easy to manufacture. No processor is required in the player, and the same player may be used with different cartridges. Another benefit is that the data representative of the sound is stored and processed on a single chip, it is not "moved" between separate components where the data could be corrupted by electronic noise or minor power variances. The connections between the cartridge and player (represented by arrows such as arrow 37 in FIG. 1) are minimized, and low integrity connections are possible.

Figure 2:
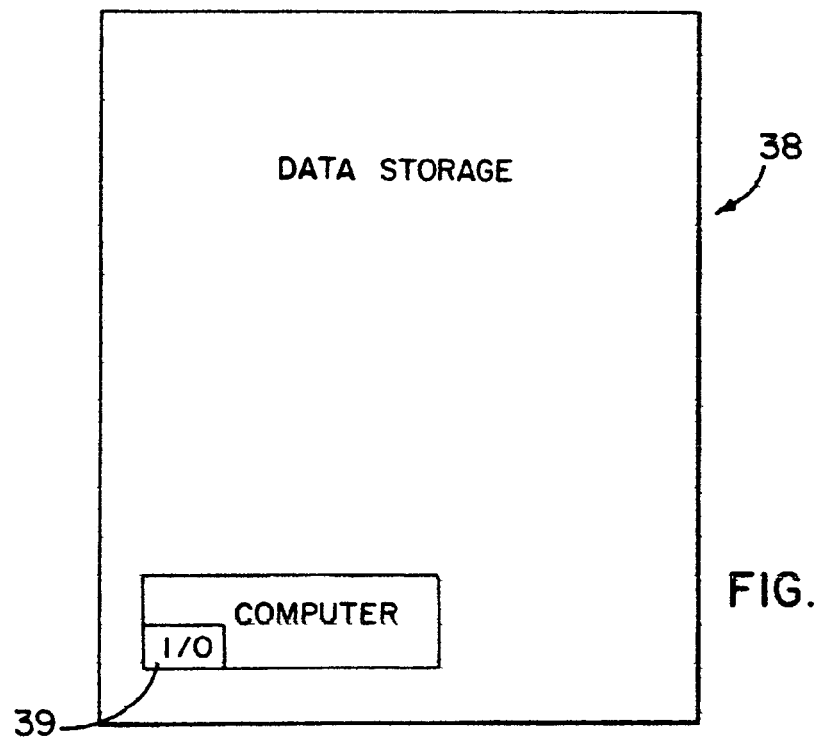
FIG. 2 is a diagram of one layout for a chip that may be used in the invention.

FIG. 2 is a diagram of one layout for a chip 38 used in a cartridge. This layout shows that most of the chip's volume is for data storage. The chip includes a computer and an I/O interface 39, but they take very little space on the chip. The chip may be thought of as "smart," because it includes processing and I/O capability, while a player associated with the chip can be "dumb," or in other words, a simple device that does not require its own processing capability and that is easily manufactured.

Figure 3:
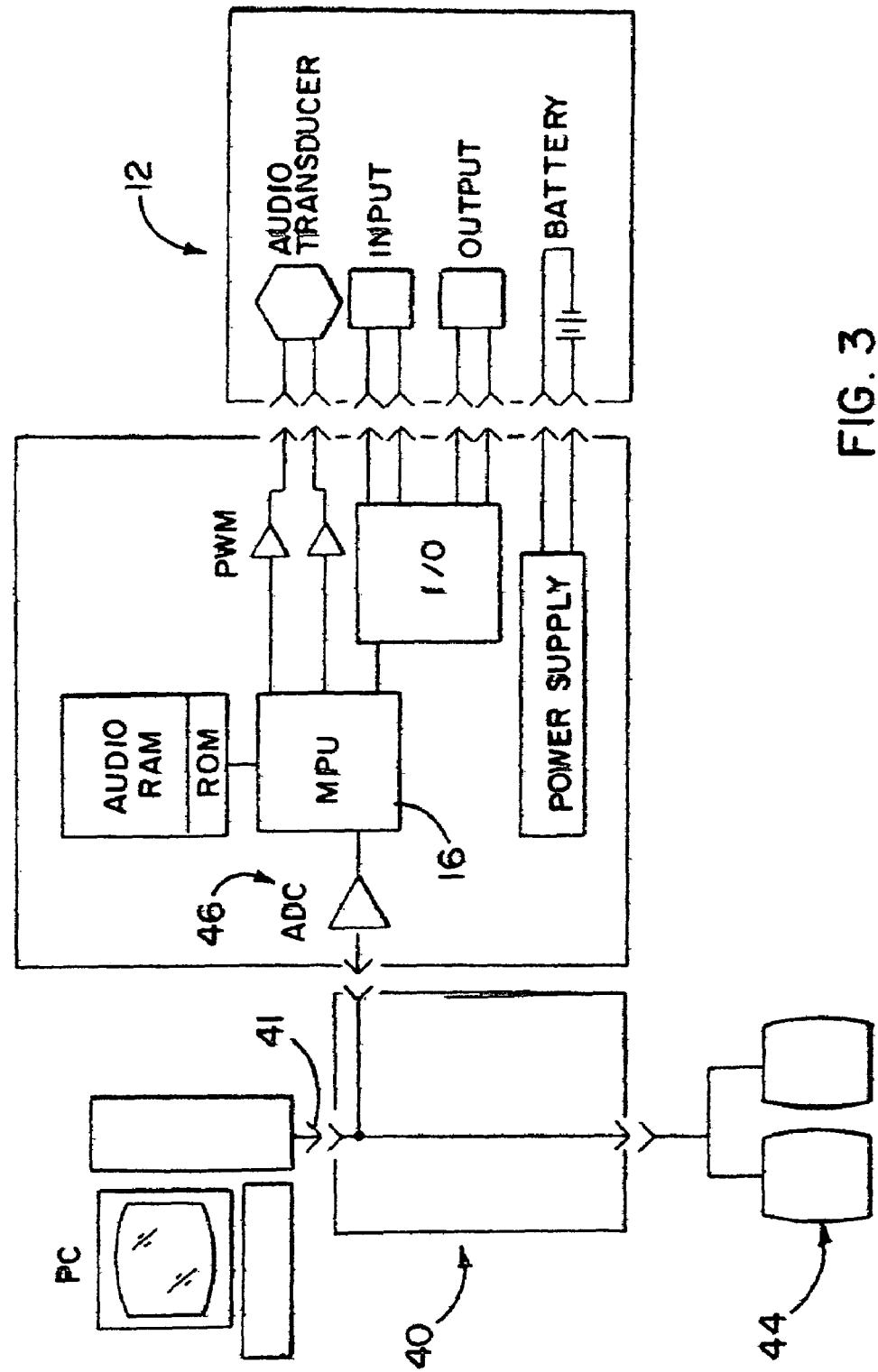
FIG. 3 is a schematic drawing of another embodiment of the invented sound and image producing system.

FIG. 3 is another embodiment of the invented sound producing system, including cartridge 10 and player 12, as discussed in connection with FIG. 1. FIG. 3, however, shows an embodiment that allows for the recording of sounds. This embodiment includes a recorder controller 40, used to record sound on cartridge 10. Recorder controller 40 is attached to a standard audio port or speaker jack 41 on a personal computer 42. The audio port typically is an amplifier output configured to output signals sufficient to drive a speaker. Recorder controller 40 receives an analog signal from the computer. That analog signal is passed through to speakers 44 associated with the computer. The signal is also directed to an analog-to-digital converter 46 on the cartridge. That converter takes the signal and changes it to a digital form, and transmits it to the micro-processor unit, where it then can be stored in memory. By taking the signal from a computer's speaker jack, an then using an analog-to-digital converter, the system avoids the need for other supporting software, and it allows the system to download and record sounds from many different computers because the signals outputted by computers to speaker jacks are in a standard, Sound Blaster, format. This embodiment allows a user to record his or her favorite music, and then play it back on the system. Sound data, including analog or digital data, may be downloaded from any source, such as the Internet or a CD-ROM. Sound data from these sources may contain music, sound, voice or machine information. Micro-processor unit 16 or some other computer, such as a computer associated with recorder controller 40, can be used to interpret sound data that is in the form of machine information to control sounds or music, to play games, or for other such tasks.

Figure 4:
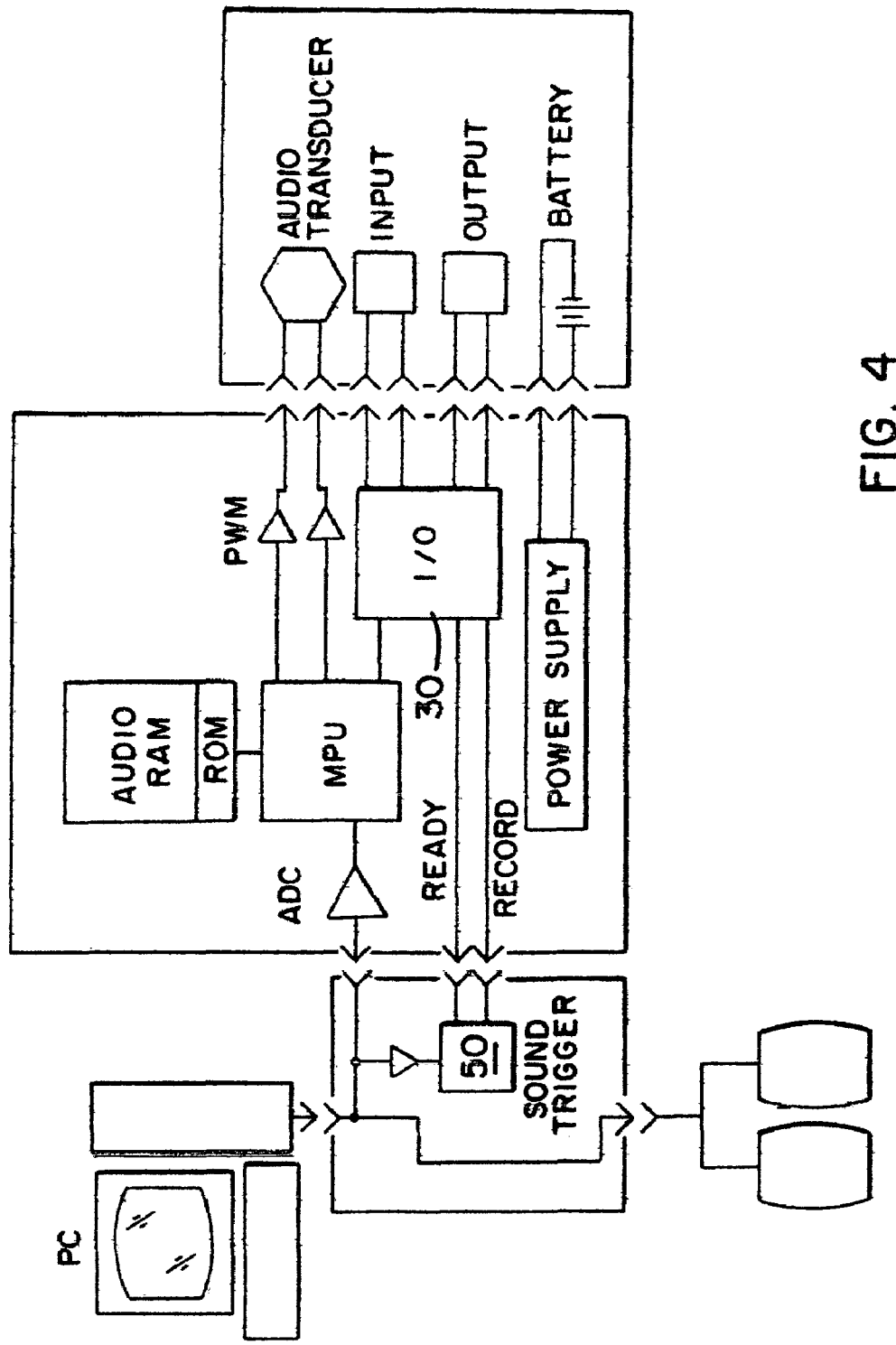
FIG. 4 is a schematic drawing of yet another embodiment of the invented sound and image producing system.

FIG. 4 is yet another embodiment of the system. This embodiment is similar to that shown in FIG. 2, except this embodiment includes a sound trigger 50 on the recorder controller to trigger the recording of sound. This sound trigger is associated with I/O 30 so that various functions can be performed. For example, the system may sequentially record different sound files instead of recording a single sound file. The sound trigger also may detect signals from the computer, and then cause the cartridge to automatically record sound. The system may record sound automatically, may record sound only when triggered by a user, or may automatically record sound detected after a user triggers the recording function.

Figure 5:
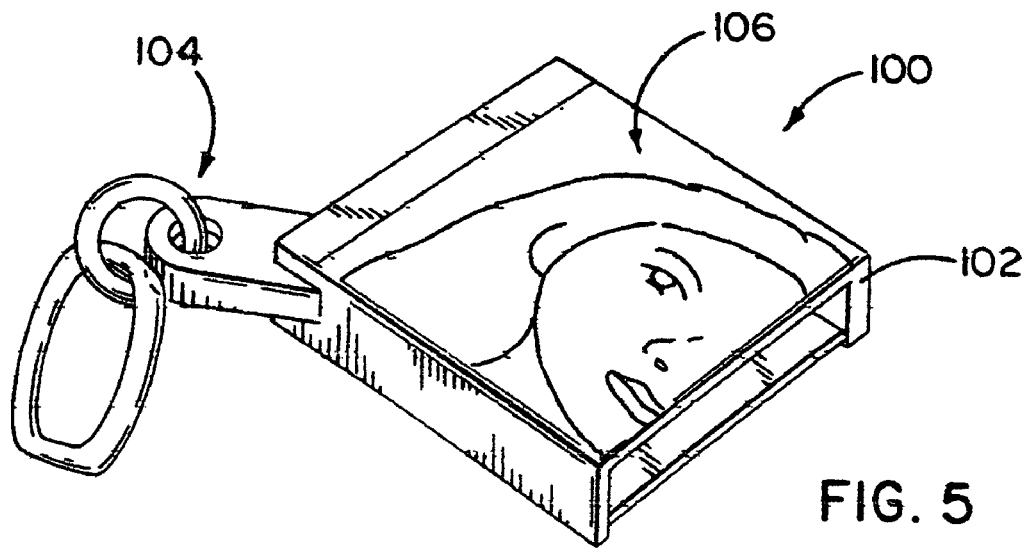
FIG. 5 shows a cartridge configured for use in the invented sound and image producing system.

FIGS. 5–10 show various cartridge and player configurations. FIG. 5 shows a cartridge 100 shaped like a small case for a compact disc. The cartridge includes a housing 102, and a loop or fob-like structure 104 on the housing to allow the cartridge to be clipped to clothing, clothing accessories, or other items. The cartridge also may include art on the housing relating to the sound stored by the cartridge. For example, artwork such as a picture 106 of a rock star is on cartridge 100, and a song by the rock star may be stored on the cartridge.

Figure 6:
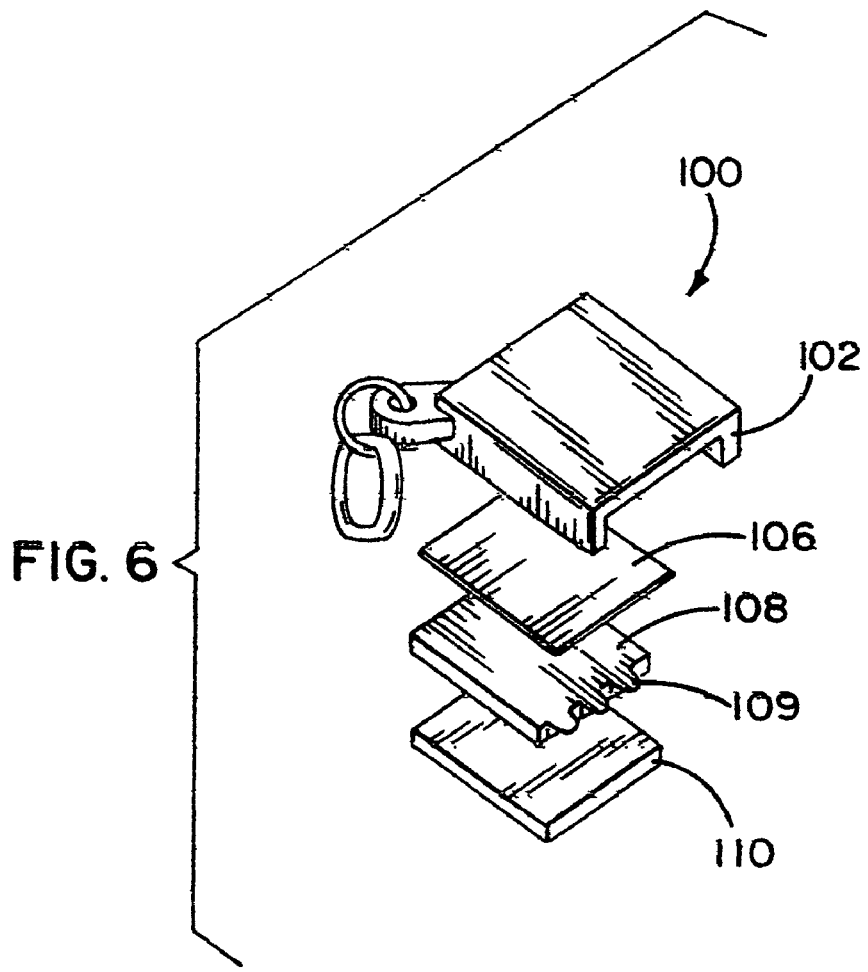
FIG. 6 shows components of a cartridge in an exploded view.

FIG. 6 shows components of cartridge 100 in an exploded view. The components include housing 102, art 106, a printed circuit board 108 with connectors 109, and a housing bottom 110. An integrated circuit, such as integrated circuit 14 discussed above, may be mounted on printed circuit board 108.

Figure 7:
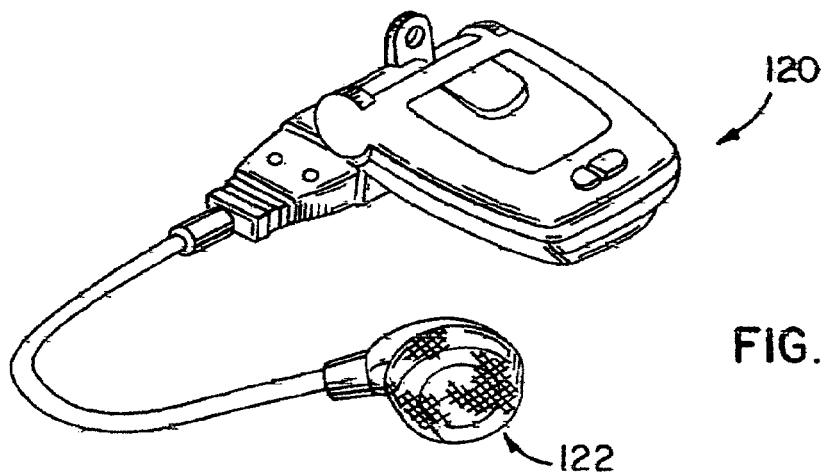
FIG. 7 shows a player for use in the invented sound and image producing system and configured to look like a small compact disc player.
Figure 8:
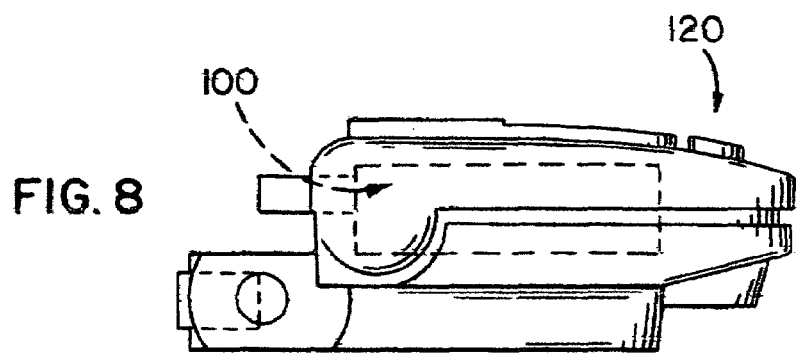
FIG. 8 shows a side view of the player of FIG. 7.
Figure 9:
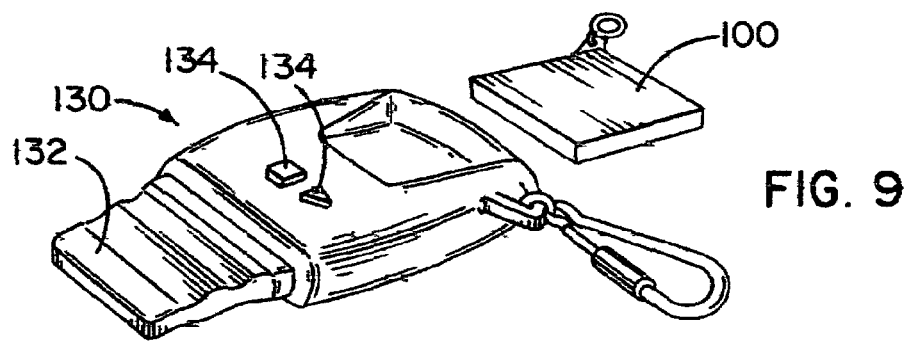
FIG. 9 shows a player configured for denta-mandibular sound transmission.
Figure 10:
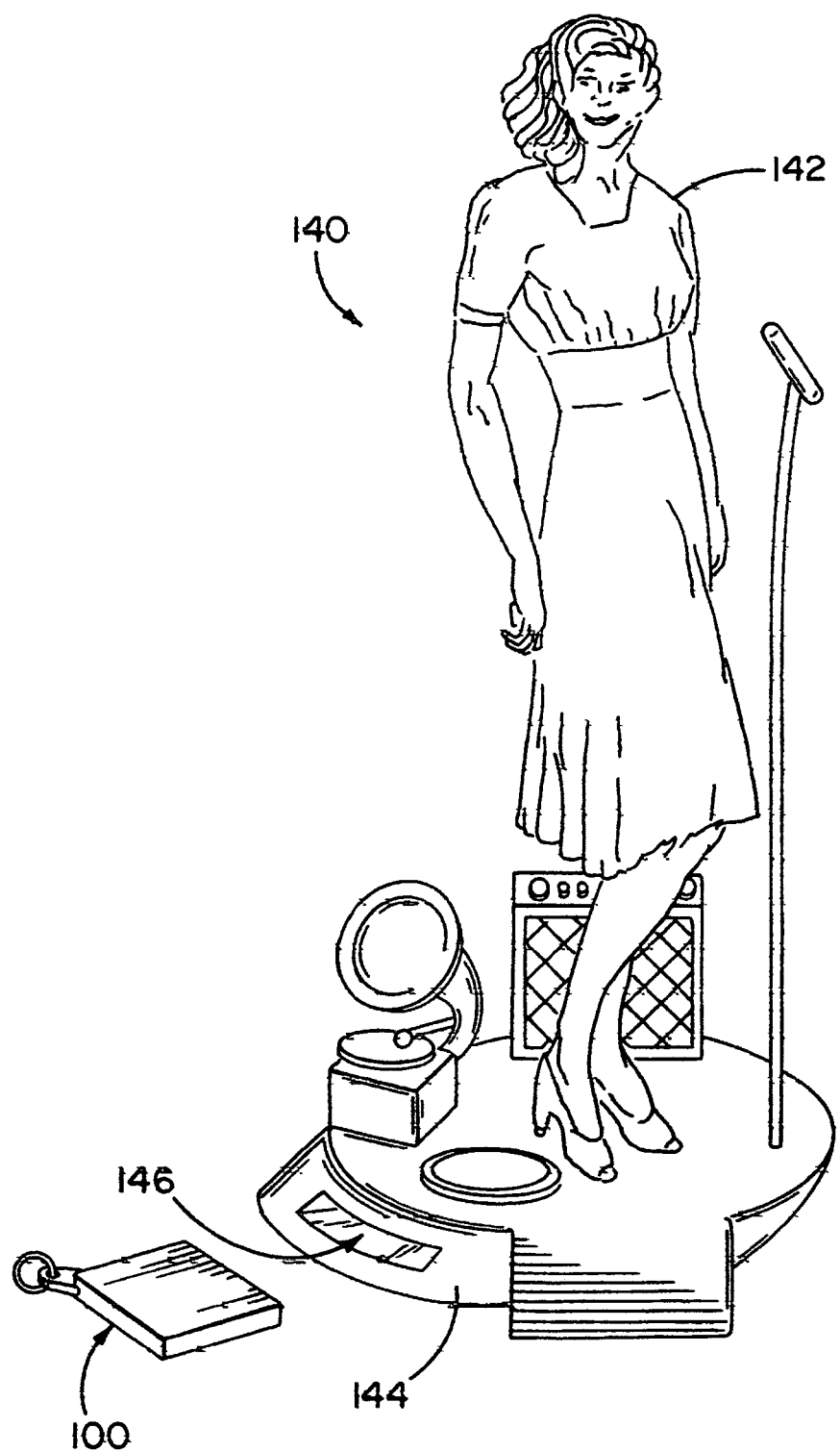
FIG. 10 shows a player configured like a toy doll or figurine.
Figure 11:
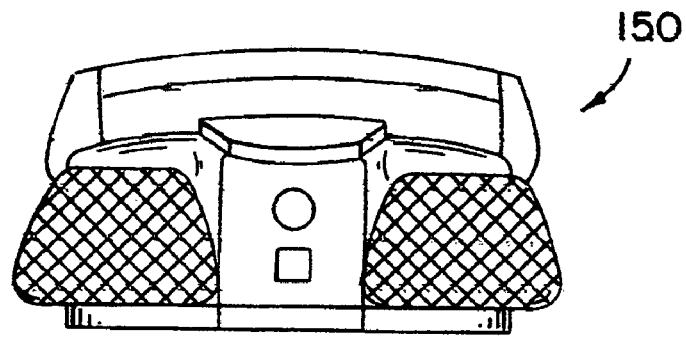
FIG. 11 shows a player configured like a small portable stereo or "boom box."
Figure 12:
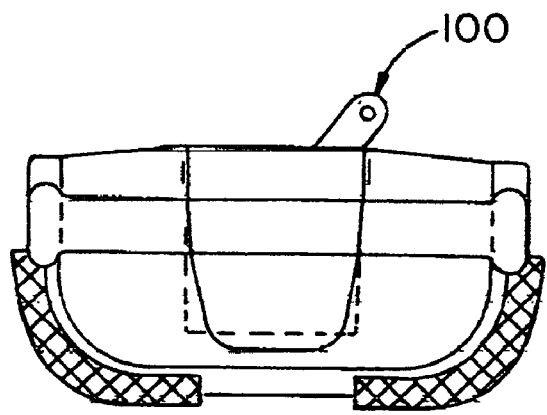
FIG. 12 shows a top view of the player of FIG. 11.
Figure 13:
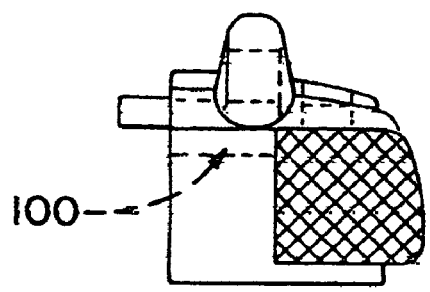
FIG. 13 shows a side view of the player of FIG. 11.

FIGS. 7–13 show various players. FIGS. 7 and 8 show a player 120 shaped like a miniature compact disc player. In FIG. 7 an ear bud or earphone 122 is shown attached to the player. FIG. 8 is a side view of the player, and it shows (in dashed lines) a cartridge 100 plugged into the player. FIG. 9 shows a player 130 configured for denta-mandibular sound transmission. That player includes a bite bar 132 configured to contact a user's teeth or mouth so that sound vibrations may travel from the bite bar through the user's teeth and jaw to the user's inner ear, where the vibrations may be perceived as sound. Player 130 also includes controls buttons 134 to control the operation of the player. Cartridge 100 is shown in FIG. 9 separate from the player, ready to be plugged into the player. The player also may take the form of a doll or figurine. For example, the player may be a figurine resembling a singer, such as a rock star, and the system could then be used to play the singer's music. FIG. 10 shows a player 140 including a doll or figurine 142 on a base 144. The base includes an opening 146 configured to receive cartridge 100, as shown. Doll 142 may be separable from the base so that it may have entertainment or play value independent and separate from the playing of sounds. In such an embodiment, the base may be thought of as a docking station. If the player is a doll resembling a music personality, and the player is configured to download and record music, then a user may record recent popular songs associated with the music personality, and then easily change the songs in the future. FIGS. 11–13 show a player 150 configured to resemble a small portable stereo, commonly called a "boom box." FIGS. 12 and 13 show cartridge 100 (drawn partially in dashed lines) plugged in or inserted into the player. Of course, the player may take various other forms as well, such as a toy car, some other toy, a watch, a necklace, a bracelet, a zipper pull, etc.

Another use of the invented sound producing system is as a music sampler.

TECHNICAL FIELD

The invention is applicable in the sound and/or image producing industries and other related industries. It is also applicable in the toy and entertainment industries.

It is believed that the disclosure set forth above encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the inventions includes all novel and non-obvious combinations and sub-combinations of the various elements, features, functions and/or properties disclosed herein. No single feature, function, element or property of the disclosed embodiments is essential to all of the disclosed inventions. Similarly, where the claims recite "a" or "a first" element or the equivalent thereof, such claims should be understood to include incorporation of one or more such elements, neither requiring nor excluding two or more such elements.

It is believed that the following claims particularly point out certain combinations and sub-combinations that are directed to one of the disclosed inventions and are novel and non-obvious. Inventions embodied in other combinations and sub-combinations of features, functions, elements and/or properties may be claimed through amendment of the present claims or presentation of new claims in this or a related application. Such amended or new claims, whether they are directed to a different invention or directed to the same invention, whether different, broader, narrower or equal in scope to the original claims, are also regarded as included within the subject matter of the inventions of the present disclosure.

What is claimed is:

1. An amusement system comprising:
a cartridge configured to store data representative of sound and to produce electrical signals representative of sound, where the cartridge includes memory, a processing system, programming executable by the processing system to produce electrical signals representative of sound from the data representative of sound, a modulator, which outputs a signal to drive an audio transducer in a player, input/output (I/O) circuitry, which controls the processor via controls included in the player, and at least one connector configured to releasably connect the cartridge to the player; and
a player to receive electrical signals representative of sound from the cartridge and to produce sound vibrations from the received signals, where the player is configured to receive the cartridge and to releasably connect to the at least one connector of the cartridge, where the player further includes a transducer to produce the sound vibrations, and controls configured to trigger the cartridge to produce electrical signals representative of sound and to transmit those signals to the transducer to produce sound vibrations, where the player is devoid of a processor to process the electrical signals received from the cartridge or sent to the cartridge and the player includes an electrical power storage or battery in the player configured to supply electrical power to the processing system in the cartridge when the cartridge is received by the player.

2. The amusement system of claim 1 where the cartridge is devoid of a transducer to produce sound vibrations from the signals representative of sound.

3. The amusement system of claim 1 where the memory, processing system, and programming of the cartridge are contained on a single chip.

4. The amusement system of claim 1 where the cartridge is configured so that it has at least one side-to-side dimension, and where the largest side-to-side dimension of the cartridge is no more than 2 inches.

5. The amusement system of claim 1 where the player includes a structure to allow the player to be clipped to clothing and clothing accessories.

6. The amusement system of claim 5 where the structure includes a loop to allow the player to be clipped to clothing and clothing accessories.

7. The amusement system of claim 1 where the cartridge includes a structure to allow the cartridge to be clipped to clothing and clothing accessories.

8. The amusement system of claim 1 where the cartridge includes a structure configured to attach the cartridge to clothing and clothing accessories.

9. The amusement system of claim 1 further comprising at least one other cartridge comprising a memory and a processing system, and where the player is configured to receive any one of the cartridges.

10. The amusement system of claim 1 where the cartridge includes a housing.

11. The amusement system of claim 10 further comprising art on the housing relating to the data stored by the cartridge.

12. The amusement system of claim 10 where the housing has a side-to-side dimension of less than 1 inch.

13. The amusement system of claim 1 where the data representative of sound is data representative of music.

14. The amusement system of claim 1 where the transducer is at least one earphone.

15. The amusement system of claim 1 where the transducer is a speaker.

16. The amusement system of claim 1 where the transducer is configured for denta-mandibular sound transmission.

17. The amusement system of claim 1 where the player is configured to include a figurine.

18. The amusement system of claim 1 where the player is configured as a toy.

19. The amusement system of claim 1 where the cartridge is configured to store data representative of images and to produce electrical signals representative of images, and where the player includes an output adapted to display images from the signals representative of images received from the cartridge.

20. The amusement system of claim 1 where the system is configured to download signals representative of sound and to store the signals in the memory of the cartridge.

21. The amusement system of claim 1 where the system is configured to download analog signals representative of sound, to convert analog signals representative of sound to digital signals representative of sound, and to store the digital signals representative of sound in the memory of the cartridge.

22. The amusement system of claim 1 where the system is configured to download analog signals representative of sound from an audio jack.

23. An amusement cartridge comprising:
a printed circuit board;
a processing system associated with the printed circuit board to produce electrical signals representative of sound from the data representative of sound;
memory associated with the printed circuit board configured to store both data representative of sound and programming executable by the processing system to produce the electrical signals representative of sound from the data representative of sound;
a modulator, which outputs a signal to drive an audio transducer in a player;
input/output (I/O) circuitry, which controls the processor via controls included in the player;
at least one connector configured to allow the cartridge to releasably connect to the player;
the player being devoid of cassette tape electromechanical player devices and devoid of a processing system but adapted to receive electrical signals representative of sound from said processing system associated with the printed circuit board of the cartridge and to produce sound vibrations from the received signals where a transducer to produce the sound vibrations;
a battery or other power supply;
controls to trigger the processing system are provided on the player separate from the amusement cartridge and coupled thereto via said at least one connector with the electrical signals representative of sound from the cartridge being coupled there through; and
a housing for the printed circuit board, processing system, modulator, I/O circuitry, and memory.

24. The amusement cartridge of claim 23 where the processing system and memory comprise a single chip.

25. A portable amusement system comprising:
a cartridge configured to store data representative of sound and to produce electrical signals representative of sound, where the cartridge includes memory, a processing system, programming executable by the processing system to produce electrical signals representative of sound from the data representative of sound, a modulator, which outputs a signal to drive an audio transducer in a portable player, input/output (I/O) circuitry, which controls the processor via controls included in the portable player, and at least one connector; and
the portable player to receive electrical signals representative of sound from the cartridge and to produce sound vibrations from the received signals, where the player is configured to receive the cartridge and to releasably connect to the at least one connector of the cartridge, the portable player being devoid of a processor to process the electrical signals received from the cartridge and the portable player further comprising a battery or other power supply separate from the cartridge to power the processing system.

26. The amusement system of claim 25, the portable player comprising controls configured to trigger the cartridge to produce electrical signals representative of sound.

27. The amusement system of claim 25 where the portable player further comprises a transducer to produce sound vibrations.

28. The amusement system of claim 27, the portable player comprising controls configured to trigger the cartridge to produce electrical signals representative of sound and to transmit those signals to the transducer to produce sound vibrations.

29. The amusement system of claim 25 where the cartridge is configured so that it has at least one side-to-side dimension, and where the largest side-to-side dimension of the cartridge is no more than 2 inches.

30. The amusement system of claim 25 where the player is configured so that it has at least one side-to-side dimension, and where the largest side-to-side dimension of the player is no more than 3 inches.

31. The amusement system of claim 25 where the player includes a structure to allow the player to be clipped to clothing and clothing accessories.

32. The amusement system of claim 25 where the cartridge includes a structure to allow the cartridge to be clipped to clothing and clothing accessories.

33. The amusement system of claim 25 where the cartridge includes a structure configured to attach the cartridge to clothing and clothing accessories.

34. The amusement system of claim 25 further comprising art on the housing relating to the data stored by the cartridge.

35. An amusement cartridge for use in an amusement system, comprising:
a printed circuit board;
a processing system associated with the printed circuit board to produce electrical signals representative of sound from the data representative of sound;
memory associated with the printed circuit board configured to store both data representative of sound and programming executable by the processing system to produce the electrical signals representative of sound from the data representative of sound;
a modulator, which outputs a signal to drive an audio transducer in a player;
input/output (I/O) circuitry, which controls the processor via controls included in the player;
at least one connector configured to allow the amusement cartridge to releasably connect to the player,
the player being devoid of cassette tape electromechanical player devices and devoid of a processing system but adapted to receive electrical signals representative of sound from said processing system associated with the printed circuit board of the amusement cartridge and to produce sound vibrations from the received signals where a transducer to produce the sound vibrations and controls to trigger the processing system are provided on the player separate from the amusement cartridge and coupled thereto via said at least one connector with the electrical signals representative of sound from the cartridge being coupled there through, where the amusement cartridge is devoid of a battery or other electrical power source and where the player includes an electrical power storage or battery configured to supply electrical power to the processing system of the amusement cartridge when the amusement cartridge is received by the player; and
a housing for the printed circuit board, processing system, modulator, I/O circuitry, and memory.

36. An amusement system comprising:

a cartridge configured to store data representative of sound and to produce electrical signals representative of sound, where the cartridge includes memory, a processing system, programming executable by the processing system to produce electrical signals representative of sound from the data representative of sound, a modulator, which outputs a signal to drive an audio transducer in a portable player, input/output (I/O) circuitry, which controls the processor via controls included in the portable player, and at least one connector; and the player to receive electrical signals representative of sound from the cartridge and to produce sound vibrations from the received signals, where the player is configured to receive the cartridge and to releasably connect to the at least one connector of the cartridge, the player being devoid of a processor to process the electrical signals received from the cartridge and the player further comprising an electrical power storage or battery separate from the cartridge to power the processing system.

37. An amusement system comprising:

a cartridge configured to store data representative of sound and to produce electrical signals representative of sound, where the cartridge includes memory, a processing system, programming executable by the processing system to produce electrical signals representative of sound from the data representative of sound, a modulator, which outputs a signal to drive an audio transducer in a portable player, input/output (I/O) circuitry, which controls the processor via controls included in the portable player, and at least one connector configured to releasably connect the cartridge to the player; and the player to receive electrical signals representative of sound from the cartridge and to produce sound vibrations from the received signals, where the player is configured to receive the cartridge and to releasably connect to the at least one connector of the cartridge, where the player further includes a transducer to produce the sound vibrations, and where the player includes controls configured to trigger the cartridge to produce electrical signals representative of sound and to transmit those signals to the transducer to produce sound vibrations, but where the player is devoid of cassette tape electromechanical player devices and devoid of a processor to process the electrical signals received from the cartridge where the player includes a battery or other electrical power storage in the player configured to supply electrical power to the processing system in the cartridge when the cartridge is received by the player.

* * * * *